United States Patent
Yamamura (10) Patent No.: US 7,616,471 B2
(45) Date of Patent: Nov. 10, 2009

(54) FERROELECTRIC MEMORY DEVICE

(75) Inventor: Mitsuhiro Yamamura, Suwa (JP)

(73) Assignee: Seiko Epson Corporation (JP)

( * ) Notice: Subject to any disclaimer, the term of this patent is extended or adjusted under 35 U.S.C. 154(b) by 339 days.

(21) Appl. No.: 11/454,173

(22) Filed: Jun. 15, 2006

(65) Prior Publication Data
US 2007/0035982 A1    Feb. 15, 2007

(30) Foreign Application Priority Data

Jul. 27, 2005  (JP) ............................. 2005-216834
Feb. 14, 2006  (JP) ............................. 2006-036679

(51) Int. Cl.
*G11C 11/22* (2006.01)

(52) U.S. Cl. .................... 365/145; 365/65; 365/185.25; 365/203

(58) Field of Classification Search ................. 365/145, 365/65, 117, 203, 205, 207, 149; 327/50–57; 369/126
See application file for complete search history.

(56) References Cited

U.S. PATENT DOCUMENTS

| | | | |
|---|---|---|---|
| 4,646,267 A * | 2/1987 | Shimohigashi et al. ...... | 365/149 |
| 6,487,103 B2 | 11/2002 | Yamamoto et al. | |
| 6,671,200 B2 * | 12/2003 | Ogiwara et al. ............ | 365/145 |
| 6,867,997 B2 * | 3/2005 | Komatsuzaki .............. | 365/145 |

FOREIGN PATENT DOCUMENTS

| | | |
|---|---|---|
| JP | 2002-133857 | 5/2002 |
| JP | 2005-078756 | 3/2005 |

OTHER PUBLICATIONS

A Survey of Circuit Innovations in Ferroelectric Random-Access Memories, A. Sheikholeslami, et al., Proceedings of the IEEE, vol. 88 No. 5, May 2000, pp. 667-689.*

* cited by examiner

*Primary Examiner*—Son Dinh
*Assistant Examiner*—Harry W Byrne
(74) *Attorney, Agent, or Firm*—Harness, Dickey & Pierce, P.L.C.

(57) ABSTRACT

A ferroelectric memory array includes a plurality of bit lines; a plurality of memory cells connected to the bit lines and storing predetermined data; and a plurality of sense amplifiers provided in correspondence with the bit lines and amplifying data that are read out from the memory cells. The sense amplifiers each include a first n-MOS transistor, a first voltage being supplied to a source of the first n-MOS transistor; a first precharge unit precharging a drain of the first n-MOS transistor to a second voltage, which is a positive voltage that is higher than the first voltage; a transistor control unit that lowers the drain voltage that has been precharged to the second voltage by controlling a resistance between the source and the drain of the first n-MOS transistor in accordance with a voltage on a corresponding bit line, when data stored in the memory cells is read out to that bit line; and a voltage control unit that lowers the voltage of the bit line in accordance with the lowering of the voltage of the drain.

16 Claims, 7 Drawing Sheets

FERROELECTRIC MEMORY DEVICE

This application claims priority of Japanese Patent Application No. 2005-216834 filed in Japan on Jul. 27, 2005, and Japanese Patent Application No. 2006-36679 filed in Japan on Feb. 14, 2006, the entire contents of which are hereby incorporated by reference.

BACKGROUND

1. Technical Field

The present invention relates to ferroelectric memory devices.

2. Related Art

A data storage device is disclosed in JP-A-2002-133857, for example. In this data storage device, the data stored in the memory cells is read out by transferring the charge, which has been accumulated in the memory cell in accordance with the data, to a charge accumulation means and amplifying the voltage generated by the charge accumulated in the charge accumulation means.

However, in this data storage device, a considerable amount of circuitry is required for the charge transfer means and the like and it is very difficult to arrange the large number of read-out circuits, so that there is the problem that the number of bits that can be read out simultaneously is limited.

SUMMARY

An advantage of some aspects of the invention is that a ferroelectric memory device is provided with which the above-noted problem can be solved. This is achieved through the combination of features of the independent patent claims. Further advantageous modifications of the invention are specified in the dependent claims.

According to one aspect of the invention, a ferroelectric memory array includes a plurality of bit lines; a plurality of memory cells connected to the bit lines and storing predetermined data; and a plurality of sense amplifiers provided in correspondence with the bit lines and amplifying data that are read out from the memory cells, the sense amplifiers each including a first n-MOS transistor, a first voltage being supplied to a source of the first n-MOS transistor; a first precharge unit precharging a drain of the first n-MOS transistor to a second voltage, which is a positive voltage that is higher than the first voltage; a transistor control unit that lowers the drain voltage that has been precharged to the second voltage by controlling a resistance between the source and the drain of the first n-MOS transistor in accordance with a voltage on a corresponding bit line, when data stored in the memory cells is read out to that bit line; and a voltage control unit that lowers the voltage of the bit line in accordance with the lowering of the voltage of the drain. According to another aspect of the invention, a ferroelectric memory array includes a plurality of bit lines; a plurality of memory cells connected to the bit lines and storing predetermined data; a plurality of sense amplifiers provided in correspondence with the bit lines and amplifying data that are read out from the memory cells; and a plurality of latch-type sense amplifiers that are respectively connected via switches to the sense amplifiers and further amplify the data that are output from the sense amplifiers; wherein the sense amplifiers each include a first n-MOS transistor, a first voltage being supplied to a source of the first n-MOS transistor; a first precharge unit precharging a drain of the first n-MOS transistor to a second voltage, which is a positive voltage that is higher than the first voltage; a transistor control unit that lowers the drain voltage that has been precharged to the second voltage by controlling a resistance between the source and the drain of the first n-MOS transistor in accordance with a voltage on a corresponding bit line, when data stored in the memory cells is read out to that bit line; and a voltage control unit that lowers the voltage of the bit line in accordance with the lowering of the voltage of the drain.

BRIEF DESCRIPTION OF THE DRAWINGS

The invention will be described with reference to the accompanying drawings, where like numbers reference like elements.

DESCRIPTION OF EXEMPLARY EMBODIMENTS (1) In accordance with one aspect of the invention, a ferroelectric memory array includes a plurality of bit lines; a plurality of memory cells connected to the bit lines and storing predetermined data; and a plurality of sense amplifiers provided in correspondence with the bit lines and amplifying data that are read out from the memory cells, the sense amplifiers each including a first n-MOS transistor, a first voltage being supplied to a source of the first n-MOS transistor; a first precharge unit precharging a drain of the first n-MOS transistor to a second voltage, which is a positive voltage that is higher than the first voltage; a transistor control unit that lowers the drain voltage that has been precharged to the second voltage by controlling a resistance between the source and the drain of the first n-MOS transistor in accordance with a voltage on a corresponding bit line, when data stored in the memory cells is read out to that bit line; and a voltage control unit that lowers the voltage of the bit line in accordance with the lowering of the voltage of the drain.

With this aspect of the invention, the voltage on the bit lines changes in accordance with the data that are read out from the memory cells, and the transistor control unit turns the first n-MOS transistor on and moreover controls its on resistance. The on resistance of the first n-MOS transistor can be changed considerably even with minuscule changes of the voltage on the bit line. Consequently, with this aspect of the invention it is possible to achieve, with a very simple configuration, a considerable difference in the drop of the drain voltage of the first n-MOS transistor, depending on the data stored in the memory cells, so that it is possible to provide a ferroelectric memory device with small circuit scale and chip area and with large read-out margin.

Moreover, with this aspect of the invention, the voltage control unit suppresses an increase of the voltage on the bit line, so that it is possible to achieve a high voltage applied to the memory cells. Consequently, with this aspect of the invention, it is possible to achieve an even larger read-out margin.

(2) This ferroelectric memory device may further include a judgment unit that, by comparing the drain voltage of the first n-MOS transistor of a predetermined one of the plurality of sense amplifiers with the drain voltages of the first n-MOS transistors of the remaining sense amplifiers, judges the data stored in the memory cells corresponding to the remaining sense amplifiers.

With this aspect of the invention, it is possible to judge the data that is stored in the memory cells even without a configuration for generating a reference voltage, so that it is possible to provide a ferroelectric memory device with small circuit scale and chip area.

(3) In accordance with another aspect of the invention, a ferroelectric memory array includes:

a plurality of bit lines;

a plurality of memory cells connected to the bit lines and storing predetermined data;

a plurality of sense amplifiers provided in correspondence with the bit lines and amplifying data that are read out from the memory cells; and a plurality of latch-type sense amplifiers that are respectively connected via switches to the sense amplifiers and further amplify the data that are output from the sense amplifiers;

wherein the sense amplifiers each include:

a first n-MOS transistor, a first voltage being supplied to a source of the first n-MOS transistor;

a first precharge unit precharging a drain of the first n-MOS transistor to a second voltage, which is a positive voltage that is higher than the first voltage;

a transistor control unit that lowers the drain voltage that has been precharged to the second voltage by controlling a resistance between the source and the drain of the first n-MOS transistor in accordance with a voltage on a corresponding bit line, when data stored in the memory cells is read out to that bit line; and a voltage control unit that lowers the voltage of the bit line in accordance with the lowering of the voltage of the drain.

With this aspect of the invention, the voltage on the bit lines changes in accordance with the data that are read out from the memory cells, and the transistor control unit turns the first n-MOS transistor on and moreover controls its on resistance. The on resistance of the first n-MOS transistor can be changed considerably even with minuscule changes of the voltage on the bit line. Consequently, with this aspect of the invention it is possible to achieve, with a very simple configuration, a considerable difference in the drop of the drain voltage of the first n-MOS transistor, depending on the data stored in the memory cells, so that it is possible to provide a ferroelectric memory device with small circuit scale and chip area and with large read-out margin.

Moreover, with this aspect of the invention, the voltage control unit suppresses an increase of the voltage on the bit line, so that it is possible to maintain a high voltage applied to the memory cells. Consequently, with this aspect of the invention, it is possible to achieve an even larger read-out margin.

Furthermore, latch-type sense amplifiers are provided at the output of the sense amplifiers, and these latch-type sense amplifiers further amplify the data that is output from the sense amplifiers, so that it is possible to provide a ferroelectric memory device with an even larger read-out margin.

(4) In this ferroelectric memory device, a first of the plurality of sense amplifiers may be connected to a first input terminal of the latch-type sense amplifiers, and a second of the plurality of sense amplifiers may be connected to a second input terminal of the latch-type sense amplifiers.

With this aspect of the invention, it is possible to perform the read-out operation by comparing the output of the first sense amplifier to the output of the second sense amplifier.

(5) In this ferroelectric memory device, a first of the plurality of sense amplifiers may be connected to a plurality of first input terminal of the latch-type sense amplifiers, and a plurality of second sense amplifiers may be respectively connected to a plurality of second input terminals of the plurality of latch-type sense amplifiers.

With this aspect of the invention, it is possible to perform the read-out operation by comparing the output of the first sense amplifier, as a reference voltage, with the output of the second sense amplifiers.

(6) This ferroelectric memory device may further include voltage conversion circuits that are respectively provided between the first and second sense amplifiers and the latch-type sense amplifiers.

With this aspect of the invention, it is possible to input a predetermined voltage into the latch-type sense amplifiers that is not affected by the size of a parasitic capacitance of the first and second sense amplifiers.

(7) This ferroelectric memory device may further include a voltage generation circuit;

wherein the voltage generation circuit is connected via a first switch to a first input terminal of the latch-type sense amplifiers and connected via a second switch to a second input terminal of the latch-type sense amplifiers;

wherein a first of the plurality of sense amplifiers is connected via a third switch to the first input terminal of the latch-type sense amplifiers and a second of the plurality of sense amplifiers is connected via a fourth switch to the second input terminal of the latch-type sense amplifiers;

wherein the first and the fourth switches are turned on and off together; and wherein the second and the third switches are turned on and off together.

With this aspect of the invention, the read-out operation can be carried out by comparing a predetermined voltage, serving as a reference voltage, generated by the voltage generation circuit with the output of the sense amplifiers. Moreover, with this aspect of the invention, the reference voltage is fixed, so that it is does not fluctuate due to the influence of variations of the memory cells, and an even more stable read-out operation can be achieved. Furthermore, the latch-type sense amplifiers are shared by two bit lines, so that the circuit scale and the chip area can be made even smaller.

(8) In this ferroelectric memory device, the plurality of memory cells may be arranged in a first and a second memory cell array;

the first sense amplifier may amplify data that are read out from memory cells arranged in the first memory cell array;

the second sense amplifier may amplify data that are read out from memory cells arranged in the second memory cell array; and the plurality of latch-type sense amplifiers may be arranged in a region between the first memory cell array and the second memory cell array.

(9) This ferroelectric memory device may further include a voltage generation circuit; and the voltage generation circuit may be connected via switches to a plurality of first input terminals of the plurality of latch-type sense amplifiers, and the plurality of sense amplifiers are respectively connected to a plurality of second input terminals of the plurality of latch-type sense amplifiers.

With this aspect of the invention, the read-out operation can be carried out by comparing a predetermined voltage, serving as a reference voltage, generated by the voltage generation circuit with the output of the sense amplifiers. Moreover, with this aspect of the invention, the reference voltage is fixed, so that it is does not fluctuate due to the influence of variations of the memory cells, and an even more stable read-out operation can be achieved.

(10) In this ferroelectric memory device, the transistor control unit may include:

a second precharge unit precharging a gate of the first n-MOS transistor to a predetermined positive voltage; and a first capacitor arranged between the bit line and the gate.

With this aspect of the invention, when the data stored in the memory cells is read out to the bit lines and the voltage on the bit lines rises, the first capacitor further increases the gate voltage of the first n-MOS transistors, which has been precharged to a predetermined positive voltage. Consequently, with this aspect of the invention, the on resistance of the first n-MOS transistor can be controlled based on the voltage on the bit lines, so that it is possible to provide a ferroelectric memory device with small circuit scale and chip area.

(11) In this ferroelectric memory device, the first capacitor may be a ferroelectric capacitor.

With this aspect of the invention, it is possible to minimize the capacitor area while maintaining a large capacitance so that it is possible to further decrease the circuit scale and the chip area.

(12) In this ferroelectric memory device, the second precharge unit may precharge the gate to a threshold voltage of the first n-MOS transistor.

With this aspect of the invention, it is possible to turn on the first n-MOS transistor and control the on resistance, even when the voltage change on the bit lines is minuscule.

(13) In this ferroelectric memory device, the voltage control unit may include a second capacitor arranged between a drain of the first n-MOS transistor and the bit line.

With this aspect of the invention, it is possible to change the voltage on the bit lines in accordance with the change of the drain voltage of the first n-MOS transistor with a very simple configuration.

(14) In this ferroelectric memory device, the second capacitor may be a ferroelectric capacitor.

With this aspect of the invention, it is possible to minimize the capacitor area while maintaining a high capacitance, so that the circuit scale and the chip area can be further decreased.

(15) In this ferroelectric memory device, the first voltage may be a ground voltage.

With this aspect of the invention, the range of voltage used in the sense amplifiers can be set to the range from the ground voltage to the predetermined positive voltage, so that it is possible to provide a ferroelectric memory device that is fast, has easy voltage control, and does not necessitate a level shift circuit.

Referring to the accompanying drawings, the following is an explanation of the invention by way of embodiments of the invention, but the invention as defined in the claims is not limited to these embodiments, and the combinations of features explained in the embodiments are not necessarily required as means to solve the object of the invention.

First Embodiment

Figure 1:
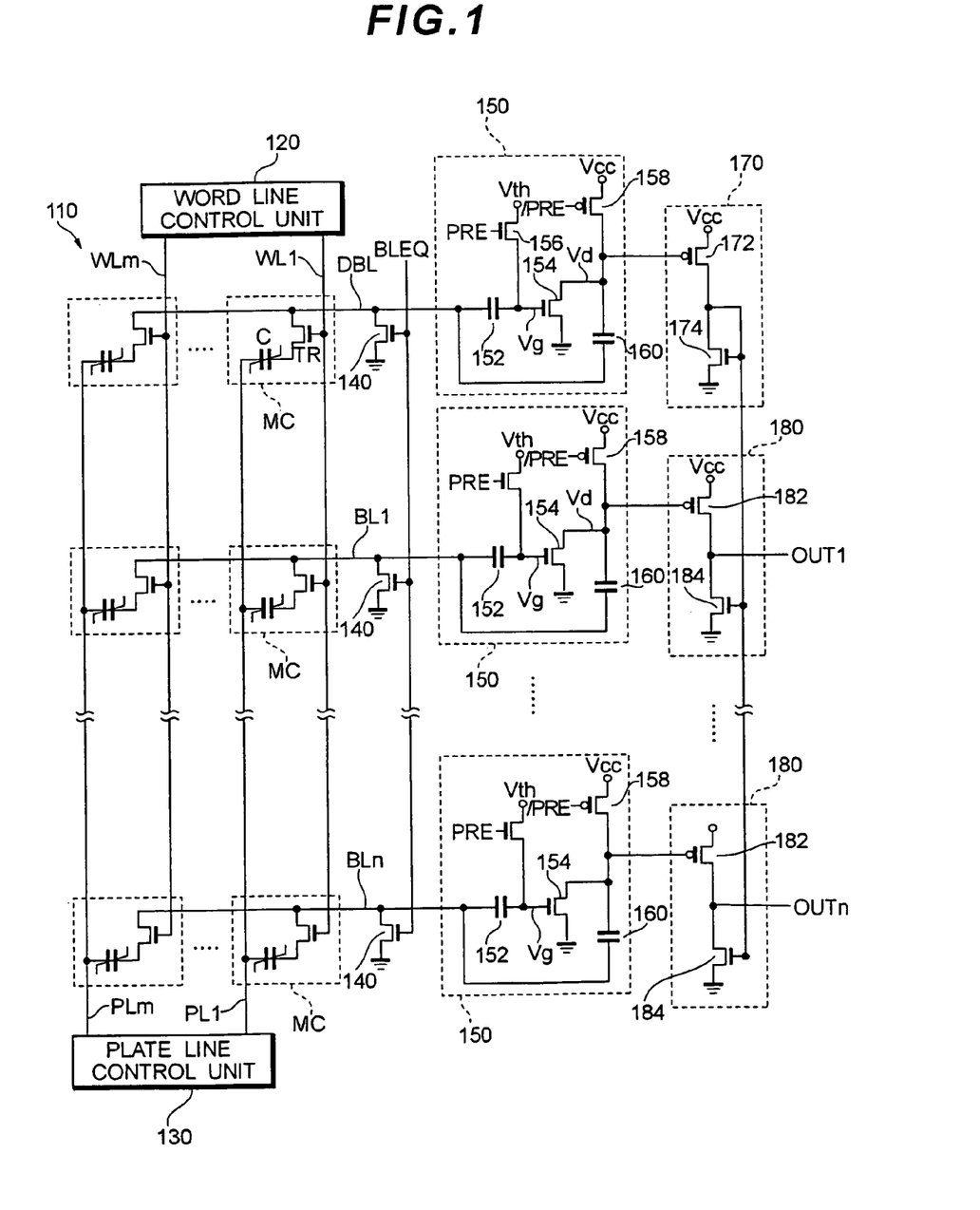
FIG. 1 is a diagram showing a ferroelectric memory device according to a first embodiment.

FIG. 1 is a diagram showing a ferroelectric memory device according to this embodiment. The ferroelectric memory device includes a memory cell array 110, a word line control unit 120, a plate line control unit 130, n-MOS transistors 140, sense amplifiers 150, a standard voltage generation unit 170 and judgment units 180. The ferroelectric memory device further includes m word lines WL1-WLm and m plate lines PL1-PLm (where m is a positive integer), n bit lines BL1-BLn (where n is a positive integer) and a dummy bit line DBL.

The memory cell array 110 includes m×n memory cells MC arranged in an array. The memory cells MC each include an n-MOS transistor TR and a ferroelectric capacitor C.

The gate of the n-MOS transistor TR is connected is connected to one of the word lines WL1 to WLm, its source is connected to either the dummy bit line DBL or one of the bit lines BL1 to BLn, and its drain is connected to a first terminal of the ferroelectric capacitor C. That is to say, based on the voltage of the word lines WL1 to WLm, the n-MOS transistors TR switch the connection of the first terminal of the ferroelectric capacitors C to the dummy bit line DBL and the bit lines BL1 to BLn or and off.

The second terminal of the ferroelectric capacitor C is connected to one of the plate lines PL1 to PLm, and a predetermined data value is stored depending on the potential difference between the two terminals of the ferroelectric capacitor C, or a predetermined charge is released to the dummy bit line DBL or the bit lines BL1 to BLn, depending on the stored data value. In the present embodiment, when the potential of the second terminal (on the side of the plate line) of the ferroelectric capacitor C becomes more than the coercive voltage higher the potential of the first terminal (on the side of the n-MOS transistor), then a "0" is stored, and if the potential of the first terminal of the ferroelectric capacitor C becomes more than the coercive voltage higher than the potential of the second terminal, then a "1" is stored.

The word line control unit 120 is connected to the word lines WL1 to WLm, and controls the voltages on the word lines WL1 to WLm. More specifically, based on an address signal supplied from outside of the ferroelectric memory device, the word line control unit 120 selects n memory cells MC connected to a predetermined one of the word lines WL1 to WLm by raising the potential of that predetermined word line WL above that of the potential of the other word lines WL.

The plate line control unit 130 is connected to the plate lines PL1 to PLm, and controls the voltages on the plate lines PL1 to PLm. More specifically, based on the address signal, the plate line control unit 130 selects a predetermined one of the plate lines PL1 to PLm by raising the potential of that predetermined plate line PL above that of the potential of the other plate lines PL. Thus, the plate line control unit 130 selects that predetermined plate line PL.

The sources of the n-MOS transistors 140 are connected to ground, and their drains are connected to the dummy bit line DBL and the bit lines BL1 to BLn. Moreover, a signal BLEQ is supplied to the gates of the n-MOS transistors 140, and depending on the voltage of this signal BLEQ, the dummy bit line and the bit lines BL1 to BLn are connected to ground.

The sense amplifiers 150 each include a capacitor 152, which is an example of a first capacitor, n-MOS transistors 154 and 156, a p-MOS transistor 158, and a capacitor 160, which is an example of a second capacitor. One sense amplifier 150 is provided for each of the dummy bit line DBL and the bit lines BL1 to BLn. The sense amplifiers 150 amplify and output the voltage on the dummy bit line DBL and the bit lines BL1 to BLn, when the data is read out from the memory cells MC.

A first terminal of the capacitor 152 is connected to the dummy bit line DBL or one of the bit lines BL1 to BLn, and its second terminal is connected to the gate of the n-MOS transistor 154. The capacitor 152 changes the gate voltage of the n-MOS transistor 154 in accordance with the change of the voltage on the dummy bit line DBL and the bit lines BL1 to BLn.

The source of the n-MOS transistor 154 is connected to ground and its drain is connected to the output of the sense amplifier 150. Moreover, the n-MOS transistor 154 is turned on or off depending on its gate voltage. When it is on, its source-drain resistance is controlled with its gate voltage.

The source of the n-MOS transistor 156 is connected to the gate of the n-MOS transistor 154, and a voltage Vth near the threshold voltage of the n-MOS transistor 154 is supplied to the drain of the n-MOS transistor 156. The gate of the n-MOS transistor 156 is charged to near its threshold voltage with the voltage of the signal PRE supplied to the gate of the n-MOS transistor 156.

The operating voltage VCC of the ferroelectric memory device, which is an example of a second voltage, is supplied to the source of the p-MOS transistor 158, and the drain of the p-MOS transistor 158 is connected to the drain of the n-MOS transistor 154. The drain of the n-MOS transistor 154 is charged to the voltage VCC with the signal /PRE (the inverted signal PRE) supplied to the gate of the p-MOS transistor 158.

A first terminal of the capacitor 160 is connected to the drain of the n-MOS transistor 154, and its second terminal is connected to either the dummy bit line DBL or one of the bit lines BL1 to BLn. The capacitor 160 changes the voltage on the dummy bit line DBL and the bit lines BL1 to BLn in accordance with the change of the drain voltage of the n-MOS transistor 154.

The standard voltage generation unit 170 and the judgment unit 180 each include a p-MOS transistor 172, 182 and an n-MOS transistor 174, 184, respectively. The judgment units 180 compare the output of the sense amplifiers 150 with the output of the standard voltage generation unit 170, and thus judge the data that is stored in the memory cells MC.

More specifically, the output of the sense amplifiers 150, that is, the drain voltage of the n-MOS transistors 154 is supplied to the respective gates of the p-MOS transistors 172 and 182. The drains of the p-MOS transistors 172 and 182 are respectively connected to the drains of the n-MOS transistors 174 and 184. Moreover, the gate of the n-MOS transistor 174 is connected to its drain. The gates of the n-MOS transistors 184 are connected to the gate and the drain of the n-MOS transistor 174, whereas the sources of the n-MOS transistors 184 are connected to ground. That is to say, the p-MOS transistor 172 and the n-MOS transistor 174 form current mirrors with the p-MOS transistors 182 and the n-MOS transistors 184.

Figure 2:
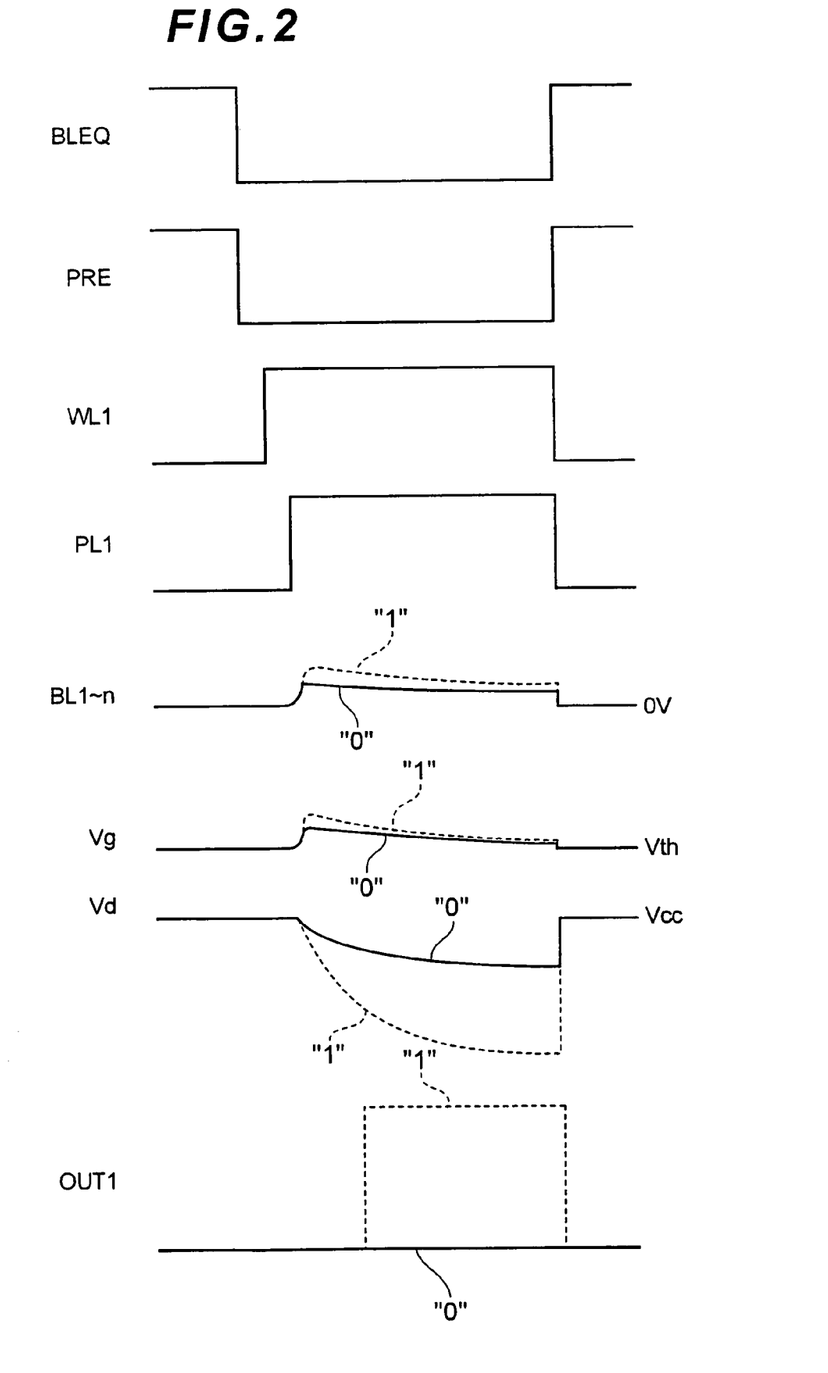
FIG. 2 is a timing chart illustrating the operation of the ferromagnetic memory device of the first embodiment.

FIG. 2 is a timing chart illustrating the operation of the ferromagnetic memory device of this embodiment. Referring to FIG. 1 and FIG. 2, the operation of the ferromagnetic memory device of this embodiment is explained, taking as an example the case that the word line WL1 and the plate line PL1 are selected to read the data stored in the memory cells MC that are connected to the bit lines BL1 to BLn.

In the following example, the voltage of signals that are logically low is the ground voltage, whereas the voltage of signals that are logically high is the operating voltage VCC, VDD or VPP of the ferroelectric memory device. It should be noted that the signal voltages are not limited to this, and that it is sufficient if the voltage of signals indicating "logical high" is higher than the voltage of signals indicating "logical low".

First, in the initial state, the signal BLEQ is logically high, the n-MOS transistors 140 are on, and the voltage on the dummy bit line DBL and the bit lines BL1 to BLn is the ground voltage. Then, the signal BLEQ becomes logically low, so that the dummy bit line DBL and the bit lines BL1 to BLn are precharged to the ground voltage.

Moreover, in the initial state, the signal PRE is logically high and the signal /PRE is logically low, so that the n-MOS transistor 156 and the p-MOS transistor 158 are on, the gate voltage of the n-MOS transistor 154 becomes the threshold voltage Vth, and its drain voltage becomes VCC. Then, the signal PRE turns logically low and the signal /PRE turns logically high, so that the gate and the drain of the n-MOS transistor 154 are respectively precharged to Vth and Vcc.

Next, the word line control unit 120 raises the voltage of the word line WL1, thereby turning on the n-MOS transistors TR of the memory cells MC connected to the word line WL1. Thus, the ferroelectric capacitors C of the memory cells MC connected to the word line WL1 are connected to the dummy bit line DBL and to the bit lines BL1 to BLn.

Then, the plate line control unit 130 raises the voltage on the plate line PL1. Thus, taking the voltage on the dummy bit line DBL and the bit lines BL1 to BLn as a reference, VCC is applied to the ferroelectric capacitors C of the memory cells MC connected to the word line WL1.

Thus, in accordance with the data stored in the ferroelectric capacitors C, the charge retrieved from those ferroelectric capacitors C is released to the dummy bit line DBL and the bit lines BL1 to BLn, so that the voltages on the dummy bit line DBL and the bit lines BL1 to BLn raise in accordance with the data stored in the individual memory cells MC. More specifically, the voltage on the dummy bit line DBL and the bit lines BL1 to BLn in the event that a data value of "1" is stored in the memory cells MC (dotted line in FIG. 2) is higher than the voltage on the dummy bit line DBL and the bit lines BL1 to BLn in the event that a data value of "0" is stored in the memory cells MC (solid line in FIG. 2).

When data is read out from the memory cells MC and the voltage on the dummy bit line DBL or on the bit lines BL1 to BLn, that is, the voltage at the first terminal of the capacitors 152 increases, then the capacitor 152 causes the voltage at the second terminal, that is, the gate voltage Vg of the n-MOS transistor 154 to rise in accordance with the voltage at the first terminal.

The gate voltage Vg of the n-MOS transistor 154 is precharged to the threshold voltage Vth, so that when the voltage at the first terminal of the capacitor 152 rises, the gate voltage Vg becomes higher than Vth, and the n-MOS transistor 154 is turned on.

When the n-MOS transistor 154 is turned on, its drain is connected to the grounded source via the channel resistance (on resistance) of the n-MOS transistor 154. Moreover, the channel resistance of the n-MOS transistor changes with the gate voltage Vg. That is to say, the channel resistance of the n-MOS transistor 154 changes in accordance with the data that is stored in the memory cell MC.

Consequently, the drain voltage Vd of the n-MOS transistor 154 drops more when the data value stored in the memory cell MC is "1" than when that data value is "0". That is to say, the n-MOS transistor 154 can amplify minuscule changes of the gate voltage Vg to large levels by changing the drain voltage Vd.

Moreover, when the drain voltage Vd, that is, the voltage at the first terminal of the capacitor 160 drops, the capacitor 160 suppresses an increase in voltage at the second terminal, that is, on the bit lines BL1 to BLn, due to this drop. Thus, the potential difference between the bit lines BL1 to BLn and the plate line PL1, that is, the voltage across the capacitors C can be maintained at a large level, so that the charge amount that is released to the bit lines BL1 to BLn can be increased.

Moreover, when the drain voltage Vd of the n-MOS transistors 154 changes, then also the gate voltages of the p-MOS transistors 172 and 182 constituting the current mirrors of the standard voltage generation unit 170 and the judgment unit 180 changes accordingly.

In the present embodiment, a "0" is stored in the ferroelectric capacitors C connected to the dummy bit line DBL. Moreover, the area of these ferroelectric capacitors C is set to be larger than that of the other ferroelectric capacitors C. Therefore, the charge amount that is released from the ferroelectric capacitor C to the dummy bit line DBL is larger than the charge amounts that are released to the bit lines BL1 to BLn from the ferroelectric capacitors C storing a "0". Consequently, a voltage that lies between the drain voltage Vd in the case that the data value stored in the memory cells MC connected to the bit lines BL1 to BLn is "0" and the drain voltage in the case that this data value is "1" is supplied as a standard voltage to the gate of the p-MOS transistor 172 of the standard voltage generation unit 170.

Then, the judgment unit 180 judges the data value stored in the memory cell MC by comparing the gate voltage of the p-MOS transistor 172 with the gate voltage of the p-MOS transistor 182. More specifically, if the gate voltage of the p-MOS transistor 182 is higher than the gate voltage of the p-MOS transistor 172, that is, if the data value stored in the memory cells MC connected to the bit lines BL1 to BLn is "0", then the drain voltage of the p-MOS transistor 182, which is the output of the judgment unit 180, rises, whereas if that data value is "1", then that drain voltage drops. Through this operation, the data stored in the ferroelectric capacitors C of the ferroelectric memory device of the present embodiment is read out.

With the present embodiment, the voltages on the bit lines BL1 to BLn change in accordance with the data stored in the memory cells MC, the capacitor 152 and the n-MOS transistor 156, which are an example of a transistor control unit, turn on the n-MOS transistor 154, and moreover control its on resistance. The on resistance of the n-MOS transistor 154 can be changed considerably by minuscule changes of the voltage on the bit lines BL1 to BLn. Consequently, with the present embodiment, a large difference between the drops of the drain voltage of the n-MOS transistor 154 depending on the data stored in the memory cell MC can be attained with a very simple configuration, so that a ferroelectric memory device can be provided, which has a small circuit scale and chip area, whose control is easy and fast, and which has a high read-out margin. Needless to say, since the circuit scale is very small, it is possible to increase the number of bits that can be read out at the same time, by providing a large number of read-out circuits.

Also, in accordance with the present embodiment, the voltage control unit suppresses an increase of the voltage of the bit lines BL1 to BLn, so that it is possible to prevent a drop of the voltage applied to the memory cells. Consequently, with the present embodiment, the read-out margin can be increased even more.

In accordance with the present embodiment, the voltage applied to the memory cells does not drop due to the read-out operation, so that the data stored in the memory cells MC can be adequately read out over the bit lines BL1 to BLn. In this situation, the voltage on the bit lines BL1 to BLn and the gate voltage of the n-MOS transistor 154 can be sustained until the data stored in the memory cells MC has been adequately read out. Consequently, with the present embodiment, the drain voltage Vd can be caused to drop sufficiently in accordance with the data stored in the memory cells MC with a very simple configuration, so that it is possible to provide a ferroelectric memory device with small circuit scale and small chip area. Furthermore, it is possible to control the on resistance, even with a minuscule voltage change on the bit lines BL1 to BLn.

In accordance with the present embodiment, a capacitor 160 is provided, so that it is possible to change the voltage on the bit lines BL1 to BLn in accordance with a change of the drain voltage of the n-MOS transistor 154 with a very simple configuration.

In accordance with the present embodiment, the range of the voltage used in the sense amplifier 150 can be set to the range from the ground voltage to the operating voltage VCC used in the ferroelectric memory device, so that it is possible to provide a ferroelectric memory device that is fast, whose voltage control easy and that does not necessitate a level shift circuit.

In accordance with the present embodiment, a standard voltage generation unit 170 is provided, so that it is possible to judge the data stored in the memory cells MC even without a configuration for generating a reference voltage, and it is possible to provide a ferroelectric memory device with small circuit scale and small chip area.

Second Embodiment

Figure 3:
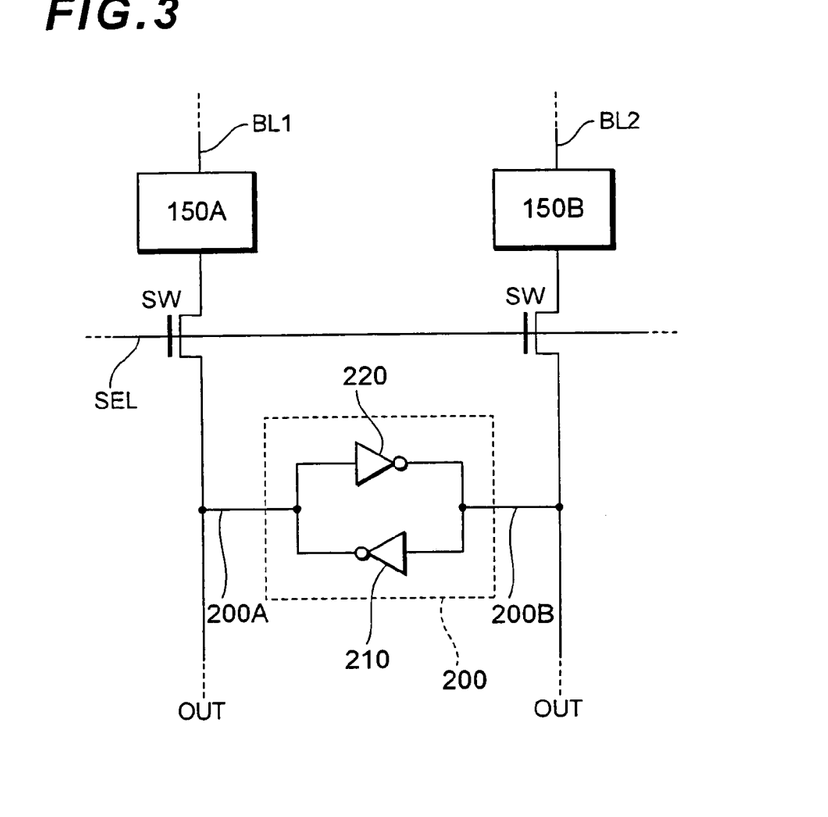
FIG. 3 is a diagram showing a portion of a ferroelectric memory device according to a second embodiment.
Figure 4:
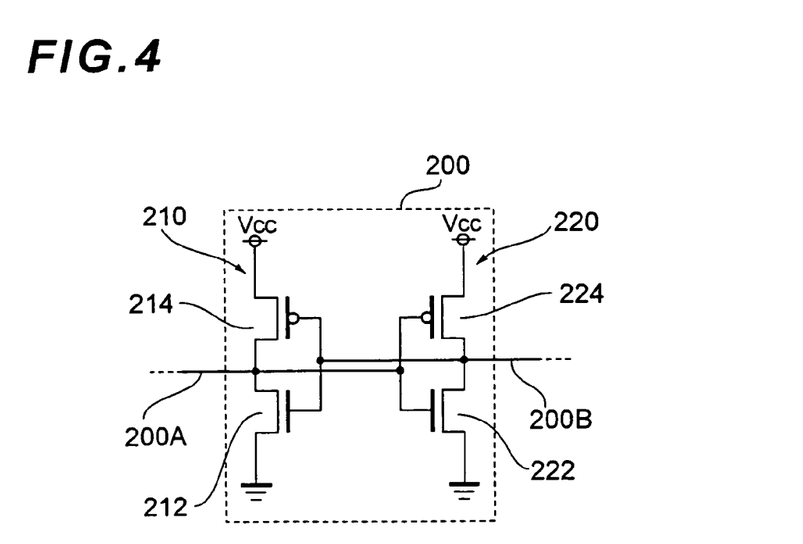
FIG. 4 is a circuit diagram of a latch-type sense amplifier in FIG. 3.

FIG. 3 is a diagram showing a portion of a ferroelectric memory device according to a second embodiment of the invention. FIG. 4 is a circuit diagram of a latch-type sense amplifier in FIG. 3. Most aspects of the configuration and operation of the present embodiment are the same as in the previously described embodiment, so that the following explanations focus on their differences.

The ferroelectric memory device according to the present embodiment further includes a latch-type sense amplifier 200. This latch-type sense amplifier 200 is connected via a switch SW to the above-described sense amplifiers 150 (see FIG. 1) and further amplifies the data output from the sense amplifiers 150. More specifically, the latch-type sense amplifier 200 includes a first and a second inverter 210, 220, whose input and output are respectively connected to each other. The latch-type sense amplifier 200 has a first input terminal 200A corresponding to the output of the first inverter 210 and the input of the second inverter 220, and a second input terminal 200B corresponding to the input of the first inverter 210 and the output of the second inverter 220. As shown in FIG. 4, in the first inverter 210, the source of an n-MOS transistor 212 is connected to ground, the source of a p-MOS transistor 214 is connected to the operating voltage VCC, and the drains of those MOS transistors 212 and 214 are connected to each other. Similarly, also in the second inverter 220, the source of an n-MOS transistor 222 is connected to ground, the source of a p-MOS transistor 224 is connected to the operating voltage VCC, and the drains of those MOS transistors 222 and 224 are connected to each other.

The ferroelectric memory device according to this embodiment includes a first sense amplifier 150A that amplifies the data supplied from the bit line BL1 and a second sense amplifier 150B that amplifies the data supplied from the bit line BL2. The first sense amplifier 150A is connected via a switch SW to the first input terminal 200A of the latch-type sense amplifier 200 and the second sense amplifier 150B is connected via a switch SW to the second input terminal 200B of the latch-type sense amplifier 200. The first and the second sense amplifiers 150A and 150B have the same circuit configuration as the above-described sense amplifiers 150. Furthermore, the switches SW are for example n-MOS transistors, and the gates of those n-MOS transistors are commonly connected to a select line SEL.

In this embodiment, different from the 1T1C-type structure generating a reference voltage in accordance with the data of the memory cell connected to the dummy bit line DBL (that is, the above-described first embodiment), a 2T2C-type structure is employed, in which the read-out operation is carried out by comparing the data of the memory cell connected to the bit line BL1 with opposite data of the memory cell connected to another bit line BL2.

It should be noted that in the present embodiment and the embodiments explained in the following, the above-explained standard voltage generation unit 170 and the judgment unit 180 can be omitted.

Next, the operation of the ferroelectric memory device according to the present embodiment is explained, taking as an example the data read-out operation.

As shown in FIG. 3, when the signal on the select line SEL is logically high, then the n-MOS transistors (that is, the switches SW) are on, and the data that is output from the first sense amplifier 150A is input to the first input terminal 200A of the latch-type sense amplifier 200, whereas the data that is output from the second sense amplifier 150B is input to the second input terminal 200B of the latch-type sense amplifier 200. The latch-type sense amplifier 200 amplifies the output voltages of the first and the second sense amplifiers 150A and 150B in accordance with the operating voltages (VCC and ground voltage) of the first and second inverters 210 and 220. For example, an output voltage of the first sense amplifier 150A corresponding to the data value "0" (for example 1V) is pulled up to VCC, and an output voltage of the second sense amplifier 150B corresponding to the data value "1" (for example 0.5V) is pulled down to 0V. Thus, providing the latch-type sense amplifier 200 makes it possible to provide a ferroelectric memory device with an even larger read-out margin.

Moreover, when the latch-type sense amplifier 200 is operating and the amplified data is output, the signal on the select line SEL is set to logically low, and the n-MOS transistors (that is, the switches SW) are turned off. Thus, it is avoided that the data that has been amplified by the latch-type sense amplifier 200 is input back into the first and the second sense amplifiers 150A and 150B, and a faulty operation of the sense amplifiers can be prevented.

Third Embodiment

Figure 5:
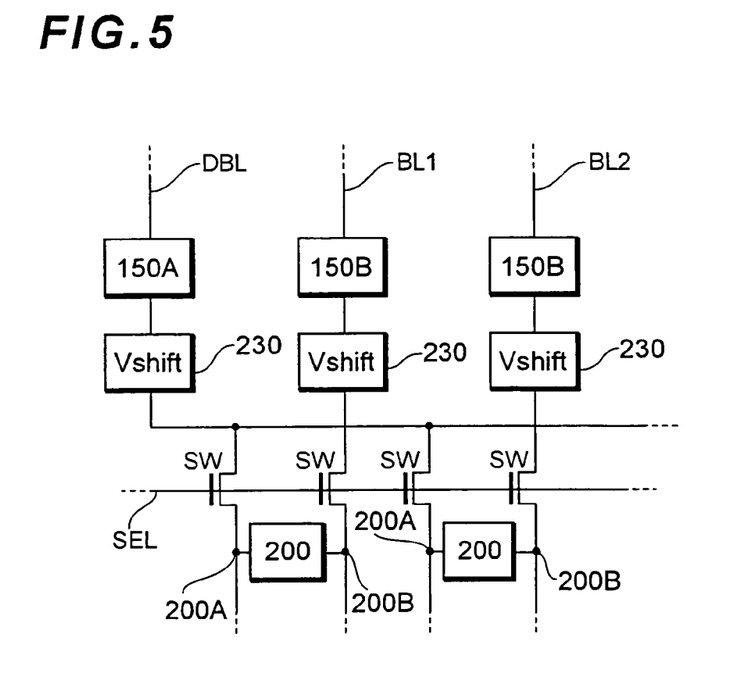
FIG. 5 is a diagram showing a portion of a ferroelectric memory device according to a third embodiment.
Figure 6:
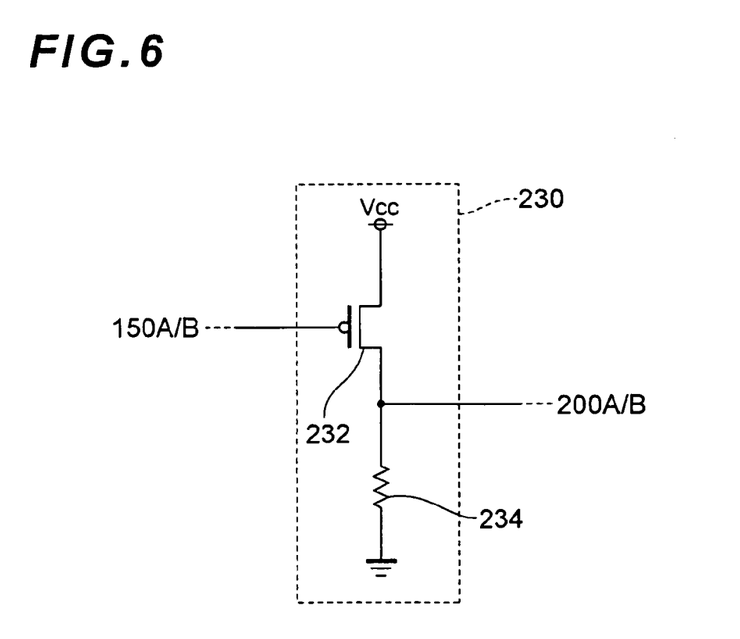
FIG. 6 is a diagram showing an example of a voltage conversion circuit in FIG. 5.

FIG. 5 is a diagram showing a portion of a ferroelectric memory device according to a third embodiment of the invention. FIG. 6 is a diagram showing an example of a voltage conversion circuit in FIG. 5. Also in this embodiment, most aspects of the configuration and operation are the same as in the previously described embodiments, so that the following explanations focus on their differences.

The ferroelectric memory device according to this embodiment is of the 1T1C type, and employs a structure generating a reference voltage based on the data of the memory cells connected to the dummy bit line DBL. More specifically, the ferroelectric memory device includes a first sense amplifier 150A amplifying the data that is supplied from the dummy bit line DBL, and a plurality of second sense amplifiers 150B amplifying the data that is supplied from the plurality of bit lines BL1, BL2, etc. The first sense amplifier 150A is connected via switches SW to each of the first input terminals 200A of a plurality of latch-type sense amplifiers 200. On the other hand, the plurality of second sense amplifiers 150B are respectively connected via switches SW to a plurality of second input terminals 200B of the plurality of latch-type sense amplifiers 200. Thus, with the present embodiment, a plurality of latch-type sense amplifiers 200 correspond to one first sense amplifier 150A, whereas one latch-type sense amplifiers 200 corresponds to a single second sense amplifier 150B. Therefore, it may happen that a parasitic capacitance that cannot be ignored occurs due to the connection of the plurality of latch-type sense amplifiers 200 to the output of the first sense amplifier 150A, so that it becomes difficult to generate the reference voltage, which is a predetermined voltage, with the first sense amplifier 150A.

Accordingly, in the present embodiment, a voltage conversion circuit (Vshift) 230 is arranged on the output side of each of the first and second sense amplifiers 150A and 150B, that is, between each of the first and second sense amplifiers 150A and 150B and the latch-type sense amplifiers 200. More specifically, the voltage conversion circuits 230 are each arranged respectively between the first and second sense amplifiers 150A and 150B and the switches SW. With this, it is possible to input a predetermined voltage into the latch-type sense amplifiers 200, independently of the size of the parasitic capacitance at the output of the first and second sense amplifiers 150A and 150B.

In the example shown in FIG. 6, the voltage conversion circuit 230 is made by connecting the source of a p-MOS transistor 232 to the operating voltage VCC, connecting the drain of the p-MOS transistor 232 to one side of a resistive component 234, and connecting the other side of the resistive component 234 to ground. The voltage conversion circuit 230 has an input terminal at the gate of the p-MOS transistor 232 and has an output terminal provided between the p-MOS transistor 232 and the resistive component 234. It should be noted that there is no particular limitation to the resistive component 234, as long as it can generate a constant current, such as a resistor or an n-MOS transistor.

Next, the operation of the ferroelectric memory device according to the present embodiment is explained, taking as an example the data read-out operation.

When the signal on the select line SEL is logically high, the n-MOS transistors (that is, the switches SW) are turned on, and the data that is output from the first sense amplifier 150A is input via the voltage conversion circuit 230 into the plurality of first input terminals 200A of the plurality of latch-type sense amplifiers 200. On the other hand, the data that is output from the second sense amplifiers 150B is input via the voltage conversion circuits 230 into the second input terminals 200B of the latch-type sense amplifiers 200. As has been explained above, the latch-type sense amplifiers 200 amplify the output voltages of the first and the second sense amplifiers 150A and 150B in accordance with their respective operating voltage (VCC or ground voltage). Thus, by providing the latch-type sense amplifiers 200, it is possible to provide a ferroelectric memory device with an even larger read-out margin.

Furthermore, when the latch-type sense amplifiers 200 are operating and the amplified data is output, the signal on the select line SEL is set to logically low, and the n-MOS transistors (that is, the switches SW) are turned off. Thus, it is avoided that the data that has been amplified by the latch-type sense amplifiers 200 is input back into the first and the second sense amplifiers 150A and 150B, and a faulty operation of the sense amplifiers can be prevented.

Fourth Embodiment

Figure 7:
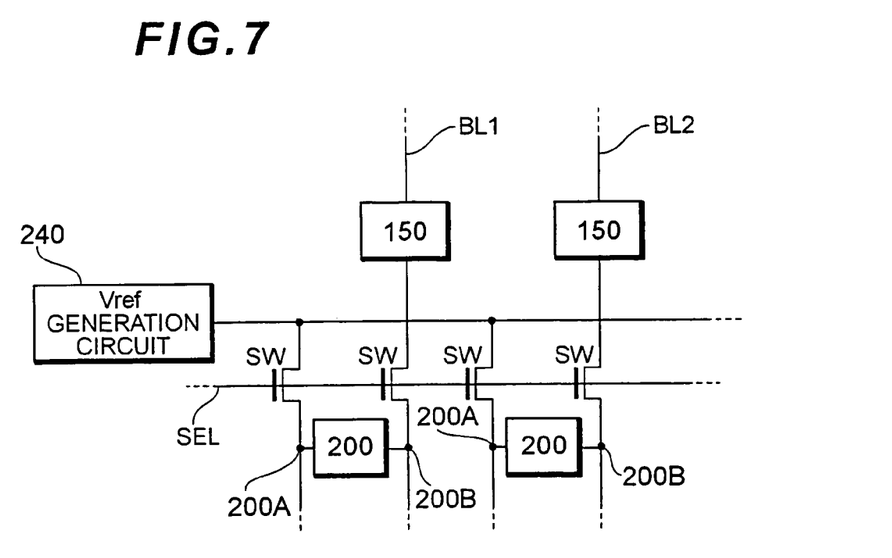
FIG. 7 is a diagram showing a portion of a ferroelectric memory device according to a fourth embodiment.
Figure 8:
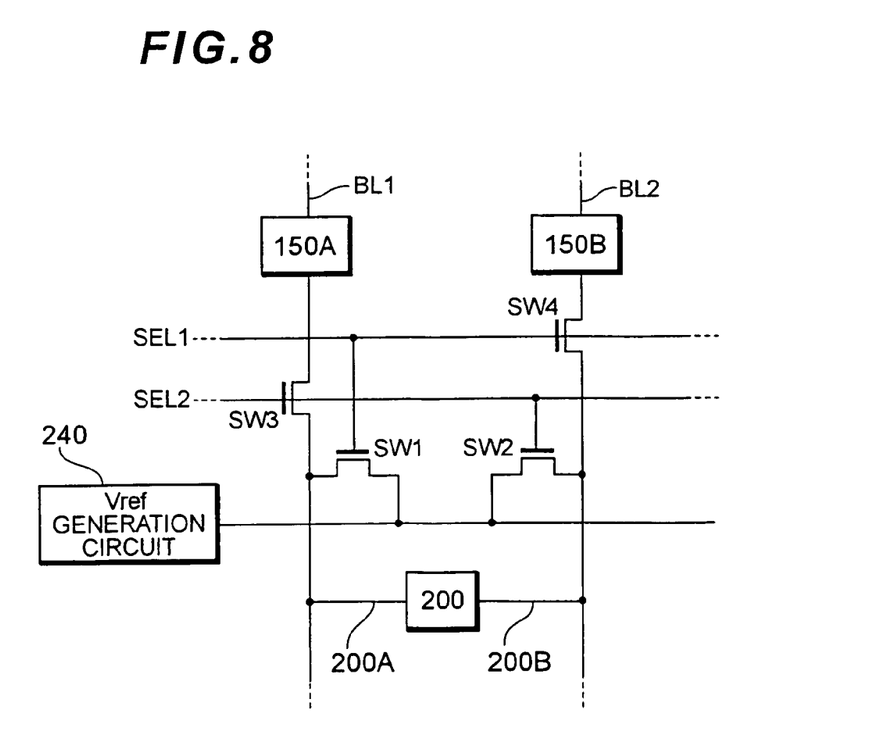
FIG. 8 is a diagram showing a modified example of the fourth embodiment.

FIG. 7 is a diagram showing a portion of a ferroelectric memory device according to a fourth embodiment of the invention. FIG. 8 is a diagram showing a modified example. Also in this embodiment, most aspects of the configuration and operation are the same as in the previously described embodiments, so that the following explanations focus on their differences.

In the ferroelectric memory device according to this embodiment, different to the embodiment generating the reference voltage based on the data of the memory cells connected to the dummy bit line DBL, a 1T1C-type structure is employed that generates the reference voltage with a voltage generation circuit (VREF generation circuit) 240. More specifically, the voltage generation circuit 240 is connected via switches SW to latch-type sense amplifiers 200. In the example shown in FIG. 7, the voltage generation circuit 240 is connected via switches SW to the plurality of first input terminals 200A of the plurality of latch-type sense amplifiers 200. On the other hand, the plurality of sense amplifiers 150 that amplify the data that is supplied from the plurality of bit lines BL1, BL2, etc. are respectively connected via switches SW to the plurality of second input terminals 200B of the plurality of latch-type sense amplifiers 200. The voltage generation circuit 240 generates a predetermined voltage set in advance, that is, a predetermined corresponding to a substantially intermediate value of the data values "0" and "1" (for example 0.75 V), so that the problem of the parasitic capacitance occurring due to the common connection of the plurality of latch-type sense amplifiers 200 is solved, and a more stable read-out operation is accomplished. Furthermore, the reference voltage is fixed, so that it does not fluctuate due to the influence of variations of the memory cells, and an even more stable read-out operation can be achieved.

In the example shown in FIG. 7, one latch-type sense amplifier 200 corresponds to one sense amplifier 150, but as a modified example, it is also possible to share one latch-type sense amplifier 200 among a first and a second sense amplifier 150A, 150B, as shown in FIG. 8.

In the example shown in FIG. 8, the voltage generation circuit 240 is connected via a first switch SW1 to a first input terminal 200A of the latch-type sense amplifier 200 and is connected via a second switch SW2 to a second input terminal 200B of the latch-type sense amplifier 200. On the other hand, the first sense amplifier 150A is connected via a third switch SW3 to the first input terminal 200A of the latch-type sense amplifier 200 and the second sense amplifier 150B is connected via a fourth switch SW4 to the second input terminal 200B of the latch-type sense amplifier 200. The gates of the n-MOS transistors of the first and fourth switches SW1 and SW4 are connected to each other by the select line SEL1, such that the first and the fourth switches SW1 and SW4 are turned on and off together, and the gates of the n-MOS transistors of the second and third switches SW2 and SW3 are connected to each other by the select line SEL2, such that the second and the third switches SW2 and SW3 are turned on and off together. Thus, the by setting the signal on one of the select lines SEL1 and SEL2 to logically high and setting the signal on the other to logically low, it is possible to input the predetermined voltage supplied from the voltage generation circuit 240 into one side of the latch-type sense amplifier 200 and to input the data supplied from the sense amplifier into the other side.

It should be noted that the two bit lines BL1 and BL2 corresponding to the same latch-type sense amplifier 200 are arranged such that data are read out with different selected word lines. That is to say, they can be arranged such that if one of the word lines is selected, data is supplied to the first sense amplifier 150A from the bit line BL1, and if another of the word lines (not shown in the drawings) is selected, then data is supplied to the second sense amplifier 150B from the bit line BL2.

Except for the aspect that the structure for supplying the reference voltage and the resulting configuration, it is possible to apply the configuration explained in the third embodiment for the operation of the ferroelectric memory device according to the present embodiment.

Fifth Embodiment

Figure 9:
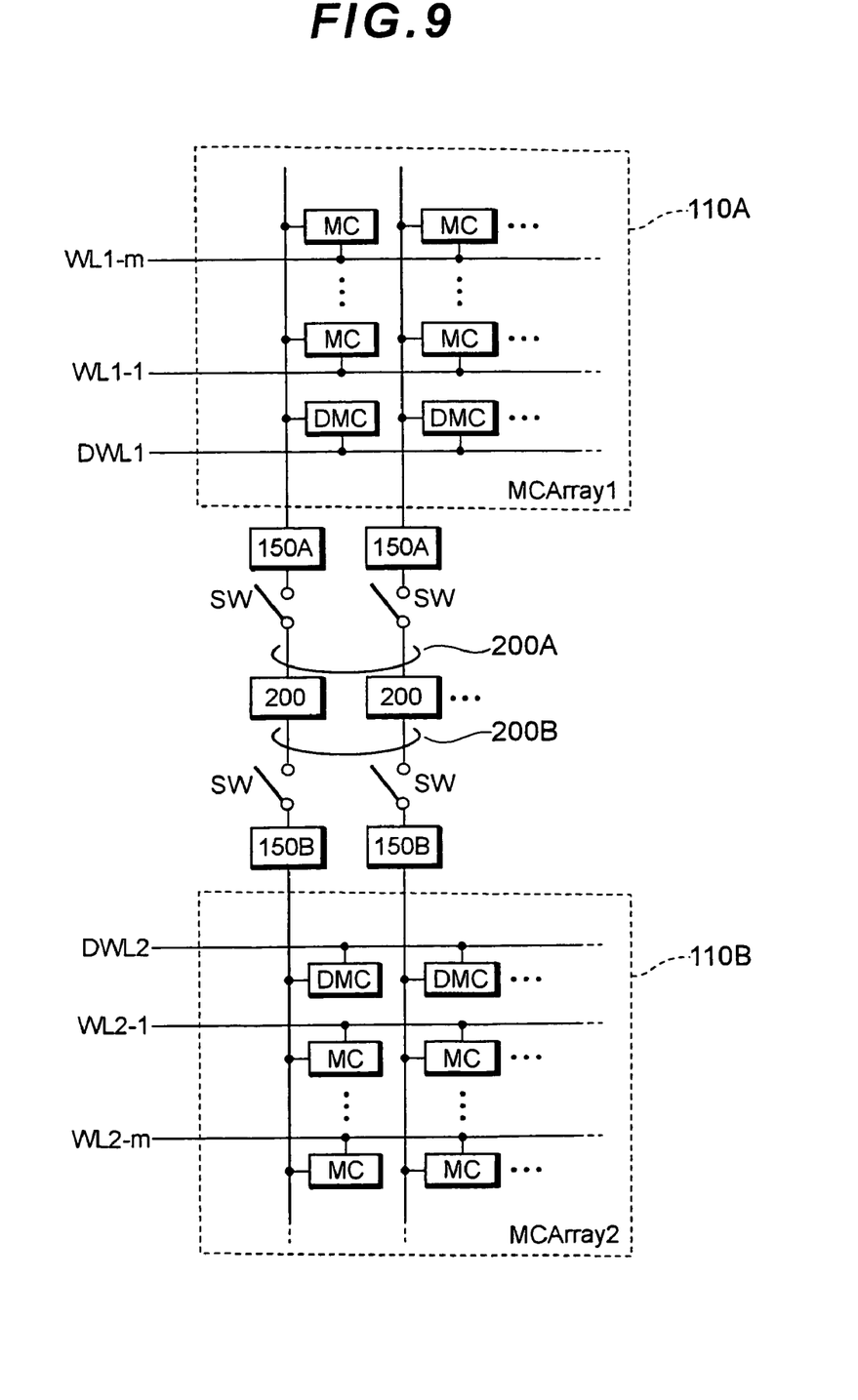
FIG. 9 is a diagram showing a ferroelectric memory device according to a fifth embodiment.
Figure 10:
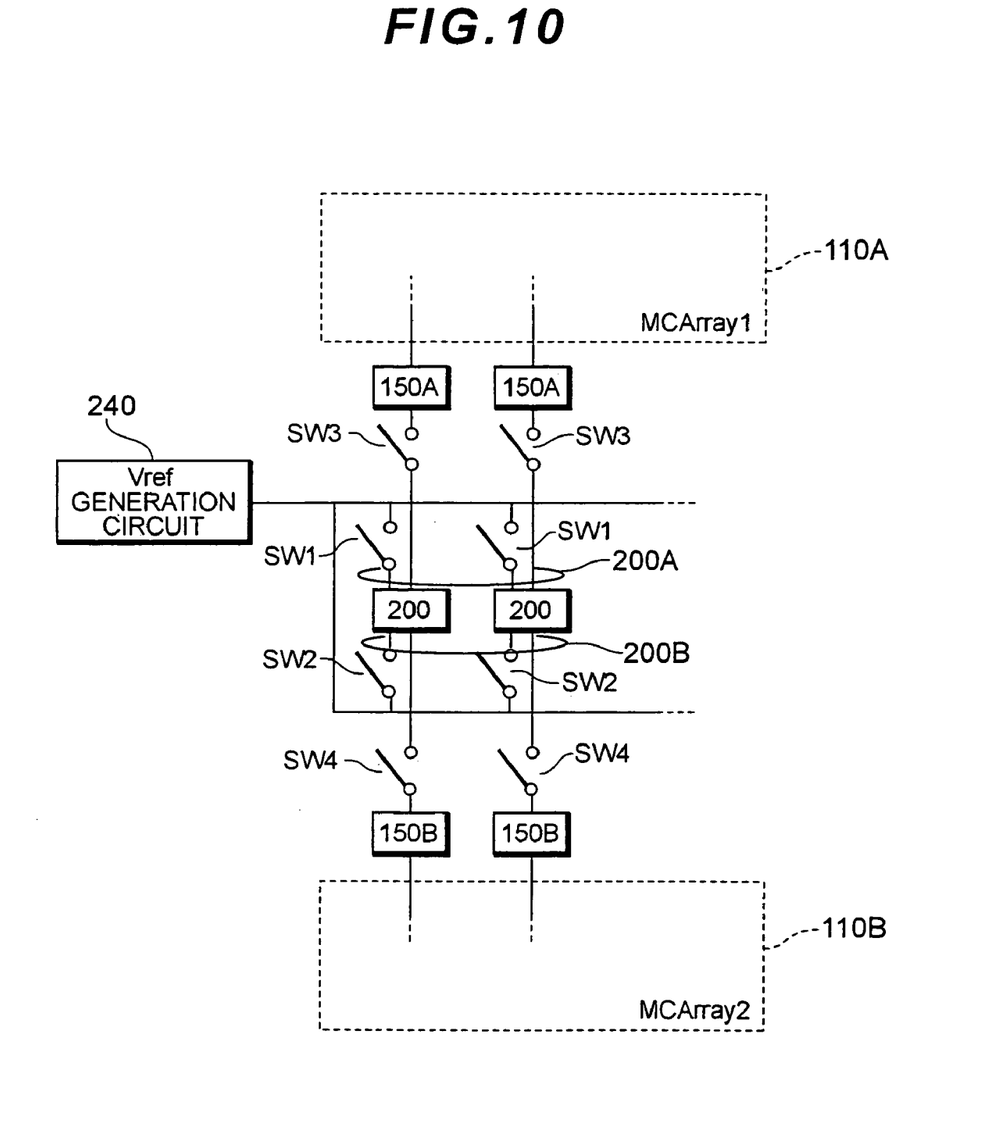
FIG. 10 is a diagram showing a ferroelectric memory device according to a fifth embodiment.

FIGS. 9 and 10 are diagrams showing a ferroelectric memory device according to a fifth embodiment of the invention, and are both diagrams showing an example in which a so-called open bit-line architecture including first and second memory cell arrays 110A and 110B provided with a plurality of memory cells is employed.

In the ferroelectric memory device of the present embodiment, the data supplied from the respective memory cells arranged in the first memory cell array 110A is supplied via first sense amplifiers 150A and switches SW to first input terminals 200A of latch-type sense amplifiers 200, whereas the data supplied from the memory cells arranged in the second memory cell array 110B is supplied via second sense amplifiers 150B and switches SW to second input terminals 200B of the latch-type sense amplifiers 200. The plurality of latch-type sense amplifiers 200 are provided in a region between the first and second memory cell arrays 110A and 110B.

In the example shown in FIG. 9, a 1T1C-type structure is shown, in which the reference voltage is generated based on the data of dummy memory cells DMC. More specifically, the first memory cell array 110A is provided with a plurality of memory cells MC corresponding to a plurality of word lines WL1-1 to WL1-$m$ and a plurality of bit lines, as well as a plurality of dummy memory cells DMC corresponding to a dummy word line DWL1 and a plurality of bit lines. That is to say, each of the bit lines is connected to a plurality of memory cells MC and to one dummy memory cell DMC. Moreover, each bit line is connected to a first sense amplifier 150A.

On the other hand, the second memory cell array 110B is provided with a plurality of memory cells MC corresponding to a plurality of word lines WL2-1 to WL1-$m$ and a plurality of bit lines, as well as a plurality of dummy memory cells DMC corresponding to a dummy word line DWL2 and a plurality of bit lines. That is to say, each of the bit lines is connected to a plurality of memory cells MC and to one dummy memory cell DMC. Moreover, each bit line is connected to a second sense amplifier 150B.

With this ferroelectric memory device, when the data stored in the memory cells MC in the first memory cell array 110A is selected (that is, when any of the word lines WL1-1 to WL1-$m$ is selected), the data stored in the dummy memory cell DMC in the second memory cell array 110B is selected (that is, the dummy word line DWL2 is selected). Thus, data "0" or "1" to be read out is supplied to the first sense amplifier 150A, whereas a predetermined voltage corresponding to an intermediate value of the data "0" and "1" to be compared is supplied to the second sense amplifier 150B. The output of the first and second sense amplifiers 150A and 150B is input via the switches SW to the latch-type sense amplifiers 200 and further amplified by those latch-type sense amplifiers 200.

The ferroelectric memory device shown in FIG. 10 has a 1T1C structure that generates the reference voltage with the voltage generation circuit 240, and moreover one latch-type sense amplifier 200 is shared by the first and the second sense amplifier 150A and 150B. That is to say, the ferroelectric memory device has the same structure as that shown in FIG. 8, except for the fact that the data of the memory cells MC belonging to different memory cell arrays 110A and 110B is supplied to each of the sense amplifiers 150A and 150B. It should be noted that the control of the switches SW1 to SW4 is as explained for the structure shown in FIG. 8.

The working examples and application examples explained by way of the foregoing embodiments can be suitably combined, modified or improved, as appropriate, and the invention is in no way limited to the above-described embodiments. It should be clear from the claims that embodiments subject to such combinations, modifications or improvements are also comprised in the technical scope of the invention.

For example, in the foregoing embodiments, if the reference voltage is generated based on the data stored in memory cells, then it is possible to make the surface area of the ferroelectric capacitors C of those memory cells large to store a "0" therein, or to make the surface area of the ferroelectric capacitor C of those memory cells small to store a "1" therein. Furthermore, in the first embodiment, it is also possible to make the surface area of the ferroelectric capacitors C of those memory cells equal to the surface area of the other ferroelectric capacitors C, and to make the drive capability of the p-MOS transistor 172 larger than the drive capability of the p-MOS transistors 182 or to make the drive capability of the n-MOS transistor 174 larger than the drive capability of the n-MOS transistors 184.

In the foregoing embodiments, it is also possible to make one or both of the capacitors 152 and 160 of the sense amplifiers 150 a ferroelectric capacitor. Thus, it is possible to achieve a miniaturization of the capacitor area while maintaining a large capacitance, so that the circuit scale and the chip area can be made even smaller.

Furthermore, in the foregoing embodiments, the 2T2C-type structure may also be applied to an open bit-line architecture. In this case, a pair of memory cells is provided in different memory cell arrays.

What is claimed is:

1. A ferroelectric memory device comprising:
a plurality of bit lines;
a plurality of memory cells connected to the bit lines and storing predetermined data; and
a plurality of sense amplifiers provided in correspondence with the bit lines and amplifying data that are read out from the memory cells,
wherein the sense amplifiers each include:
a first n-MOS transistor, a first voltage being supplied to a source of the first n-MOS transistor;
a first precharge unit precharging a drain of the first n-MOS transistor to a second voltage, which is a positive voltage that is higher than the first voltage;
a transistor control unit that lowers the drain voltage that has been precharged to the second voltage by controlling a resistance between the source and the drain of the first n-MOS transistor in accordance with a voltage on a corresponding bit line, when data stored in the memory cells is read out to that bit line; and
a voltage control unit that lowers the voltage of the bit line in accordance with the lowering of the voltage of the drain,
wherein the transistor control unit comprises:
a second precharge unit precharging a gate of the first n-MOS transistor to a predetermined positive voltage; and
a first capacitor arranged between the bit line and the gate,
wherein the first capacitor is a ferroelectric capacitor.

2. The ferroelectric memory device according to claim 1, further comprising a judgment unit that, by comparing the drain voltage of the first n-MOS transistor of a predetermined one of the plurality of sense amplifiers with the drain voltages of the first n-MOS transistors of the remaining sense amplifiers, judges the data stored in the memory cells corresponding to the remaining sense amplifiers.

3. The ferroelectric memory device according to claim 1, further comprising
a plurality of latch-type sense amplifiers that are respectively connected via switches to the sense amplifiers and further amplify data that are output from the sense amplifiers.

4. The ferroelectric memory device according to claim 3, wherein a first of the plurality of sense amplifiers is connected to a first input terminal of the latch-type sense amplifiers, and a second of the plurality of sense amplifiers is connected to a second input terminal of the latch-type sense amplifiers.

5. The ferroelectric memory device according to claim 3, wherein a first of the plurality of sense amplifiers is connected to a plurality of first input terminal of the latch-type sense amplifiers, and a plurality of second sense amplifiers are respectively connected to a plurality of second input terminals of the plurality of latch-type sense amplifiers.

6. The ferroelectric memory device according to claim 5, further comprising voltage conversion circuits that are respectively provided between the first and second sense amplifiers and the latch-type sense amplifiers.

7. The ferroelectric memory device according to claim 3, further comprising a voltage generation circuit;
wherein the voltage generation circuit is connected via a first switch to a first input terminal of the latch-type sense amplifiers and connected via a second switch to a second input terminal of the latch-type sense amplifiers;
wherein a first of the plurality of sense amplifiers is connected via a third switch to the first input terminal of the latch-type sense amplifiers and a second of the plurality of sense amplifiers is connected via a fourth switch to the second input terminal of the latch-type sense amplifiers;
wherein the first and the fourth switches are turned on and off together; and
wherein the second and the third switches are turned on and off together.

8. The ferroelectric memory device according to claim 4, wherein the plurality of memory cells are arranged in a first and a second memory cell array;
wherein the first sense amplifier amplifies data that are read out from memory cells arranged in the first memory cell array;
wherein the second sense amplifier amplifies data that are read out from memory cells arranged in the second memory cell array; and
wherein the plurality of latch-type sense amplifiers are arranged in a region between the first memory cell array and the second memory cell array.

9. The ferroelectric memory device according to claim 3, further comprising a voltage generation circuit;
wherein the voltage generation circuit is connected via switches to a plurality of first input terminals of the plurality of latch-type sense amplifiers, and the plurality of sense amplifiers are respectively connected to a plurality of second input terminals of the plurality of latch-type sense amplifiers.

10. The ferroelectric memory device according to claim 1, wherein the second precharge unit precharges the gate to a threshold voltage of the first n-MOS transistor.

11. The ferroelectric memory device according to claim claim 3, wherein the second precharge unit precharges the gate to a threshold voltage of the first n-MOS transistor.

12. The ferroelectric memory device according to claim 1, wherein the voltage control unit comprises a second capacitor arranged between a drain of the first n-MOS transistor and the bit line.

13. The ferroelectric memory device according to claim 3, wherein the voltage control unit comprises a second capacitor arranged between a drain of the first n-MOS transistor and the bit line.

14. The ferroelectric memory device according to claim 12, wherein the second capacitor is a ferroelectric capacitor.

15. The ferroelectric memory device according to claim 13, wherein the second capacitor is a ferroelectric capacitor.

16. The ferroelectric memory device according to claim 1, wherein the first voltage is a ground voltage.

\* \* \* \* \*